(12) United States Patent
Halvorsen et al.

(10) Patent No.: US 10,693,031 B2
(45) Date of Patent: *Jun. 23, 2020

(54) MULTICRYSTALLINE SILICON INGOTS, SILICON MASTERALLOY, METHOD FOR INCREASING THE YIELD OF MULTICRYSTALLINE SILICON INGOTS FOR SOLAR CELLS

(71) Applicant: REC Solar Norway AS, Kristiansand S (NO)

(72) Inventors: Gunnar Halvorsen, Kristiansand (NO); Anne-Karin Soiland, Kristiansand (NO)

(73) Assignee: REC SOLAR NORWAY AS, Kristiansand S (NO)

( * ) Notice: Subject to any disclaimer, the term of this patent is extended or adjusted under 35 U.S.C. 154(b) by 0 days.

This patent is subject to a terminal disclaimer.

(21) Appl. No.: 16/023,317

(22) Filed: Jun. 29, 2018

(65) Prior Publication Data

US 2018/0309014 A1    Oct. 25, 2018

Related U.S. Application Data

(63) Continuation of application No. 14/916,406, filed as application No. PCT/NO2014/050165 on Sep. 9, 2014, now Pat. No. 10,483,428.

(30) Foreign Application Priority Data

Sep. 9, 2013  (NO) .................................. 20131216
Oct. 1, 2013  (WO) ................ PCT/NO2013/000046
May 15, 2014  (NO) .................................. 20140621

(51) Int. Cl.

| C30B 29/00 | (2006.01) |
| C30B 7/00 | (2006.01) |
| C30B 9/00 | (2006.01) |
| H01L 31/18 | (2006.01) |
| C30B 29/06 | (2006.01) |
| C30B 11/06 | (2006.01) |
| C01B 33/02 | (2006.01) |

(52) U.S. Cl.
CPC ............ *H01L 31/182* (2013.01); *C01B 33/02* (2013.01); *C30B 11/065* (2013.01); *C30B 29/06* (2013.01); *Y02E 10/546* (2013.01); *Y02P 70/521* (2015.11)

(58) Field of Classification Search
CPC ......... C30B 29/06; C30B 11/002; C30B 7/00; C30B 9/00
See application file for complete search history.

(56) References Cited

U.S. PATENT DOCUMENTS

| 4,200,621 A | 4/1980 | Liaw et al. |
| 4,539,194 A * | 9/1985 | Halvorsen ............. C01B 33/037 423/348 |
| 5,431,869 A | 7/1995 | Kumar et al. |
| 6,861,040 B1 | 3/2005 | Ceccaroli et al. |
| 2001/0032580 A1 | 10/2001 | Phillips et al. |
| 2002/0086119 A1 | 7/2002 | Hariharan et al. |
| 2009/0159230 A1 | 6/2009 | Tsuchida et al. |
| 2011/0167961 A1 * | 7/2011 | Saugusa ................ C01B 33/037 75/343 |
| 2011/0217225 A1 | 9/2011 | Schmid et al. |
| 2011/0250118 A1 | 10/2011 | Zeaiter |
| 2013/0192302 A1 | 8/2013 | Philllips et al. |

FOREIGN PATENT DOCUMENTS

| CN | 1133262 A | 10/1996 |
| CN | 1902129 A | 1/2007 |
| CN | 101423220 A | 5/2009 |
| DE | 3804248 A1 | 8/1989 |
| EP | 0002135 A1 | 5/1979 |
| EP | 1958923 A1 | 8/2008 |
| KR | 20130074464 A | 7/2013 |
| WO | 01/42136 A1 | 6/2001 |
| WO | 2005063621 A1 | 7/2005 |

OTHER PUBLICATIONS

Y. Boulfrad, et al; Enhanced performance in the deteriorated area of . . . ; Department of Materials Science and Engineering; 10 pages.
J. Groebner, et al; Experimental study of ternary Ca—Mg—Si phase equilibria and . . . ; Science Direct; Intermetallics; vol. 11; 2003; pp. 1065-1074.
R. Kvande, et al; Effect of crucible purity and interface characteristics on multicrystalline . . . ; 21st European photovoltaic solar energy conference; Sep. 4-8, 2006; Dresden, Germany; pp. 1052-1056.
P.S. Ravishankar; Liquid encapsulated bridgman (LEB) method for directional solidification of silicon using . . . ; Journal of Crystal Growth; vol. 94; 1989; pp. 62-68.

(Continued)

Primary Examiner — Haidung D Nguyen
(74) Attorney, Agent, or Firm — Lucas & Mercanti, LLP

(57) ABSTRACT

The present invention comprises directionally solidified multicrystalline silicon ingots, a silicon masteralloy for increasing the efficiency of solar cells made from wafers cut from the silicon ingots, method for increasing the yield when producing multicrystalline silicon ingots from a silicon melt by directional solidification. Further the present invention comprises a method for preparing said silicon masteralloy.

7 Claims, 6 Drawing Sheets

(56) References Cited

OTHER PUBLICATIONS

B. Ryningen, et al; On the role of calcium in multicrystalline silicon; 27th European photovoltaic solar energy conference and exhibition; pp. 1018-1022.
Y. Tan, et al; Removal of aluminum and calcium in multicrystalline silicon by vacuum induction melting . . . ; Vacuum; vol. 99; 2014; pp. 272-276.
V. Vahanissi, et al; Significant minority carrier lifetime improvement in red edge zone in n-type multicrystalline silicon; Solar Energy Materials and Solar Cells; vol. 114; 2013; pp. 54-58.
International Search Report dated Jan. 23, 2015 for PCT/NO2014/050165.
Norwegian Search Report for Patent Application No. 20140621.
IPRP for PCT/NO2014/050165.
International Search Report and Written Opinion for PCT/NO2013/000046.
Extended European Search Report and Office Action dated Apr. 21, 2017 for Patent Application No. 14843034.1-1373.
Chinese Office Action for corresponding Chinese Application No. 201480049485.1 (4 Pages) (dated Sep. 11, 2017).
Chinese Search Report for corresponding Chinese Application No. 201480049485.1. (2 Pages).
Olsen et al., "Studies of Selected Silicon Feedstock Impurities Effect on Properties of Multicrystalline Silicon Ingots", 20th European Photovoltaic Solar Energy Conference, 2005, pp. 1082-1085.

* cited by examiner

100% virgin polysilicon a)

100% ESS® b)

100% ESS® c)

MULTICRYSTALLINE SILICON INGOTS, SILICON MASTERALLOY, METHOD FOR INCREASING THE YIELD OF MULTICRYSTALLINE SILICON INGOTS FOR SOLAR CELLS

CROSS-REFERENCE TO RELATED APPLICATIONS

This application is a continuation of copending U.S. application Ser. No. 14/916,406, filed Mar. 3, 2016, which is a 371 of PCT/N02014/050165 filed on Sep. 9, 2014 which, in turn, claimed the priority of Norwegian Patent Application No. 20131216 filed on Sep. 9, 2013, International Patent Application No. PCT/N02013/000046 filed on Oct. 1, 2013 and Norwegian Patent Application No. 20140621 filed on May 15, 2014, all applications are incorporated herein by reference.

FIELD OF INVENTION

The present invention comprises a silicon composition for increased yield of multicrystalline silicon ingots, and for increasing the efficiency of solar cells made from wafers cut from the silicon ingots. In addition the present invention comprises a method for increasing the yield when producing multicrystalline silicon ingots from a silicon melt by directional solidification. Further the present invention comprises a silicon masteralloy and method for preparing said silicon masteralloy for addition to the silicon melt for producing the multicrystalline silicon ingots in order to increase the yield of multicrystalline silicon ingots for solar cells, and for increasing the efficiency of solar cells made from wafers cut from the silicon ingots.

BACKGROUND ART

By directional solidification of silicon for production of multicrystalline silicon ingots a so-called "red zone" is formed along the outer part of the ingot, in the lower end of the ingot and at the top end of the ingot. The red zone is typically 2-3 cm thick and may be characterized by a short life time for minority carriers. The life time of minority carriers in the red zone area is measured to below the quality requirement of above 2 μs. The red zone area of directionally solidified ingots is therefore normally cut away and thus not used for wafers for solar cell production. The red zone area of the directional solidified multicrystalline silicon ingot reduces the yield of the ingot. The red zone appears both in polysilicon and in compensated silicon (silicon containing both boron and phosphorus) even though the red zone normally is thicker in compensated silicon than in polysilicon.

The reason of the formation of red zone at the lower end, along the walls and at the upper end of the directional solidified silicon ingots has been related to different kinds of defects; see Y. Boulfrad: Investigation of the Red Zone of multicrystalline Silicon Ingots for Solar cells; Doctoral Thesis at NTNU, Norway 2012:84. The main type of defect is caused by Fe and 0 diffusing into the solid silicon from the crucible and/or from the coating used in the crucible. Further defects such as dislocations and a synergistic effect between the different types of defects may also be present. Further there is a tendency that particles are present near the upper end of directional solidified silicon ingots. The upper part of the ingots must also for this reason be cut off and thereby limiting the yield.

In order to increase the yield of the silicon ingots it is desirable to minimize or totally avoid formation of the red zone, particularly in the lower end of the silicon ingots which would increase the useful part of the silicon ingots suitable for wafers and solar cell processing. It would further be advantageous if the content of particles near the upper end of the directional solidified silicon ingot could be reduced.

SUMMARY OF THE INVENTION

The present invention is conceived to solve or at least alleviate the problems identified above. Specifically, an object of the invention is to provide a silicon ingot and a method in which the yield when producing multicrystalline silicon ingots for solar cells from a silicon melt is increased, by improving the electrical properties (minority carrier lifetime and solar cell efficiency) of the ingot both in the red zone and in the bulk of the ingot.

The present invention comprises directionally solidified multicrystalline silicon ingots, wherein said ingot comprises elemental calcium added to a silicon melt in an amount chosen from at least one of the following ranges: 5-9.99 ppmw, 10-500 ppmw, 500-550 ppmw. The yield of the directionally solidified multicrystalline silicon ingot is increased resulting in higher utilisation of the ingot when cut to wafers, thus increasing the wafer yield. Further, a silicon composition according to the present invention wherein elemental calcium is added to the silicon melt in an amount chosen from at least one of the following ranges: 5-9.99, 10-500, 10-250, 20-250, 10-150, 20-150, 10-100, 10-150 ppmw. The silicon melt is chosen among polysilicon and compensated silicon.

The present invention comprises a silicon masteralloy for addition to silicon when making directionally solidified multicrystalline silicon ingot to increase yield and electrical properties of the ingot, in which said silicon masteralloy comprises elemental calcium in an amount chosen from at least one of the following ranges: 0.5-20 weight %, 1-15 weight %, 5-15 weight %, the remaining being high purity silicon.

Further the present invention comprises a silicon masteralloy for increased yield in multicrystalline silicon ingots in which said silicon masteralloy comprises elemental calcium in an amount chosen from at least one of the following ranges: 0.5-20 weight %, 1-15 weight %, 5-15 weight %, the remaining being high purity silicon. Furthermore, said silicon masteralloy is optionally added to a silicon melt when directionally solidifying silicon ingot.

Furthermore a method for increasing the yield of directional solidified multicrystalline silicon ingots is also comprised in which elemental calcium is added to the silicon melt in an amount chosen from at least one of the following ranges: 5-9.99 ppmw, 10-500 ppmw, 500-550 ppmw prior to subjecting the silicon melt to directional solidification in a crucible. In the present invention calcium is added to the silicon melt in an amount chosen from at least one of the following ranges: 5-9.99, 10-500, 10-250, 20-250, 10-150, 20-150, 10-100, 10-150, 500-550 ppmw.

The present invention comprises a method for preparing a silicon masteralloy for increasing the yield of multicrystalline silicon ingots, in which said method comprises addition of elemental calcium to a molten silicon in an amount chosen from at least one of the following ranges: 0.5-20 weight %, 1-15 weight %, 5-15 weight %, homogenizing the resulting alloy and solidifying said alloy to provide said silicon masteralloy. Said silicon masteralloy is optionally added to a silicon melt when directionally solidifying a silicon ingot.

The silicon melt which also should be understood as molten silicon can be chosen among at least one of the following: a high purity silicon melt, compensated silicon and polysilicon. According to the invention said silicon masteralloy described above is added to a charge comprising silicon for producing multicrystalline silicon ingots with increased yield. In the present invention silicon ingots with increased yield are produced by directionally solidifying multi-crystalline silicon ingots from said silicon melt. The present invention also concerns use of a master alloy comprising elemental calcium in an amount chosen from at least one of the following ranges: 0.5-20 weight %, 1-15 weight %, 5-15 weight %, the remaining being high purity silicon for directionally solidifying multicrystalline silicone ingot for increasing yield and electrical properties of said ingot.

The present invention thus relates to a method for minimizing or removing the red zone in multicrystalline silicon ingots, wherein elemental calcium in an amount between 10 and 500 ppmw is added to the silicon before the silicon is subjected to directional solidification in a crucible.

Further the present invention relates to a method for minimizing or removing the red zone in directionally solidified multicrystalline silicon ingots, in which elemental calcium is added to a silicon melt in an amount chosen from at least one of the following ranges: 5-9.99 ppmw, 10-500 ppmw, 500-550 ppmw prior to subjecting the silicon to directional solidification in a crucible.

According to a preferred embodiment the elemental calcium are added to the silicon in an amount of between 20 and 250 ppmw.

Elemental calcium can be added to the silicon in the crucible for directional solidification before the silicon is melted or after the silicon is melted.

It has surprisingly been found that the addition of small amounts of elemental calcium substantially reduces the extent of the red zone in directionally solidified multicrystalline silicon ingots.

The effect of reducing the red zone by adding elemental calcium to the silicon before directional solidification has been found to be effective both for boron doped polysilicon and for so-called compensated high purity silicon which contains both boron and phosphorus.

A shorter part of the lower end of the directionally solidified silicon ingot can thus be cut away before wafering, thereby increasing the yield of the ingots. The same is true for the upper end of the ingot and the sides of the ingots.

SHORT DESCRIPTION OF THE DRAWINGS

Figure 8:
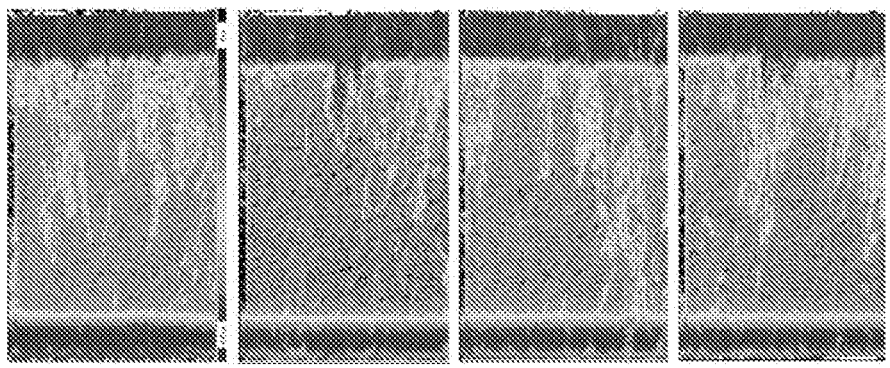
Figure 8:
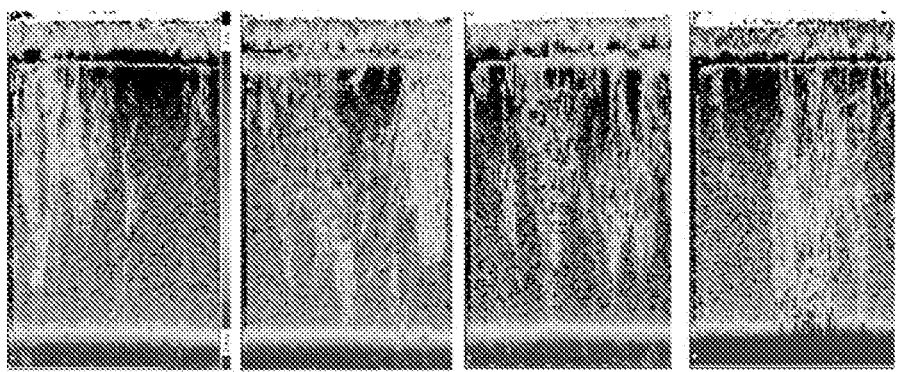
Figure 8:
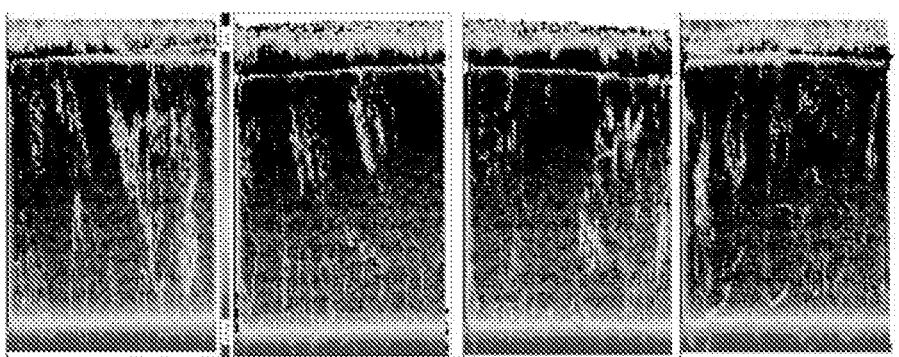

FIG. 8 shows lifetime scans of one adjacent to center brick from all four sides, a) for an ingot with 100% virgin polysilicon made without addition of silicon-calcium masteralloy and average lifetime 4.0 µs, b) for an ingot with 100% ESS® with addition of silicon-calcium masteralloy and average lifetime 5.3 µs and c) for an ingot with 100% ESS® with addition of silicon-calcium masteralloy (bottom) and average lifetime 7.1 µs. Scale of the lifetime scan from 0.4 to 8 µs.

Figure 9:
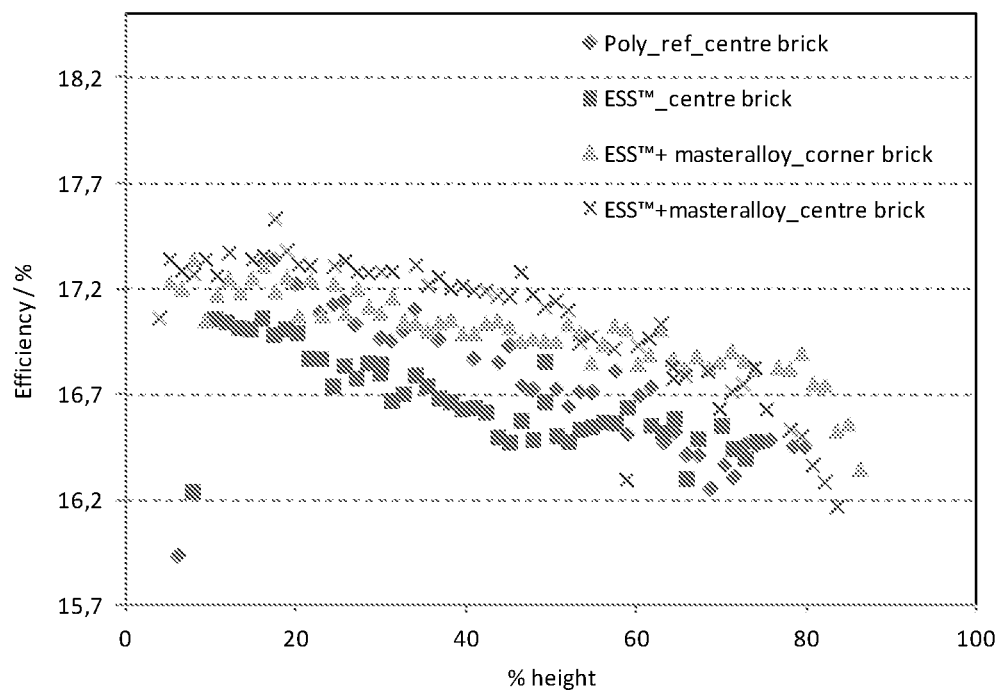

FIG. 9 shows efficiency of solar cells made from wafers cut from adjacent to centre brick and corner brick from G5 ingot made with addition of silicon-calcium masteralloy compared to reference ingots (adjacent to centre brick) of 100% virgin polysilicon and 100% ESS® made in the same furnace. All wafers were processed at International Solar Energy Research Centre in Konstanz, Germany, (ISC).

DETAILED DESCRIPTION

"Calcium" within the context of the of the present invention, shall be understood as elemental calcium.

Regarding the present invention it has been observed that addition of calcium to the silicon charge when producing directional solidified multicrystalline silicon ingots can significantly improve the ingot properties, in particular the so-called red-zone (low lifetime regions) close to the crucible, thus increasing the yield of the ingot. In addition enhancement of the cell efficiencies of solar cells from this region has been observed according to the present invention.

As the melting temperature of calcium is much lower than the melting temperature of silicon, a challenge when adding elemental calcium to the silicon charge is that calcium melts at a lower temperature than silicon. This may cause reactions of molten calcium with the coating and the crucible. These reactions may in some cases result in sticking of the ingot to the crucible, which may lead to cracking of the ingot. In one embodiment of the present invention elemental calcium is added as a silicon-calcium masteralloy containing calcium in the range 0.5-20 weight %. The silicon-calcium masteralloy can then be added to the silicon charge when producing multicrystalline silicon ingot. Addition of calcium in the form of a silicon-calcium masteralloy according to the present invention will ensure melting of calcium close to the melting temperature of silicon. In one embodiment of the present invention, addition of a silicon-calcium masteralloy to a silicon melt for producing multicrystalline silicon ingots, will ensure a simplified addition of calcium and solve any problem that addition of elemental calcium may cause.

Example 1

Four directionally solidified multicrystalline silicon ingots A, B, C and D of 16 kg each are produced at the same time in a furnace with four solidification chambers. This means that all four ingots A to D were produced under exactly the same conditions. Ingot A was a polysilicon ingot which was doped with boron to obtain a resistivity of between 1 and 1.3 ohm cm measured at the lower end of the ingot without addition of calcium. Ingot B was a polysilicon with addition of 40 ppmw elemental calcium, according to the present invention. Ingot C was compensated silicon containing both boron and phosphorus produced by Elkem Solar AS, (ESS®), and having a resistivity of between 1 and 1.3 ohm cm measured at the lower end of the ingot. Ingot D was compensated silicon produced by Elkem Solar AS, (ESS®), with addition of 40 ppmw elemental calcium, according to the present invention.

The height of the Ingots A to D was 145 mm and the cross-sectional area was 220 mm×220 mm.

Figure 2:
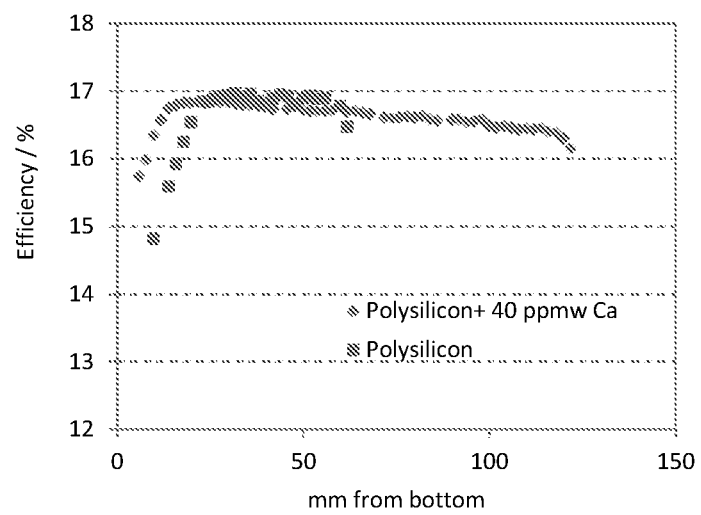
FIG. 2 is a diagram showing the efficiency of solar cells made from wafers cut from the whole height of ingots A and B in Example 1 as a function of mm from bottom of the ingots.
Figure 3:
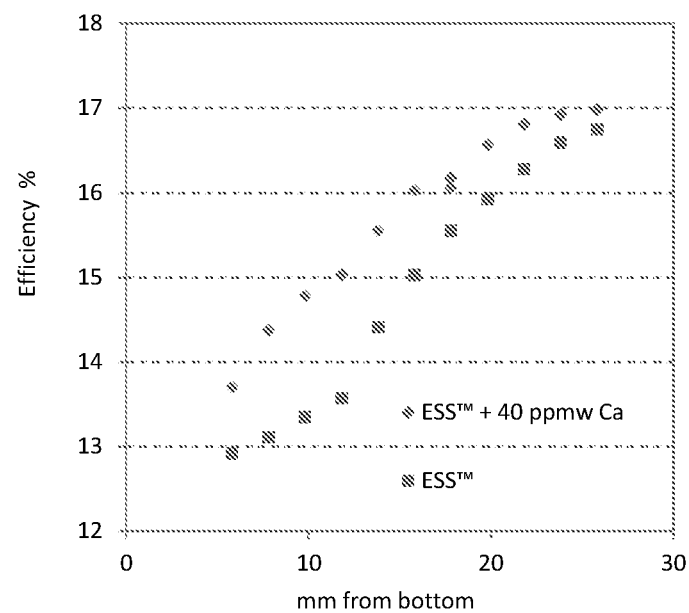
FIG. 3 is a diagram showing the efficiency of solar cells made from wafers cut from the lower part of ingots C and D in Example 1 as a function of mm from bottom of the ingots.
Figure 4:
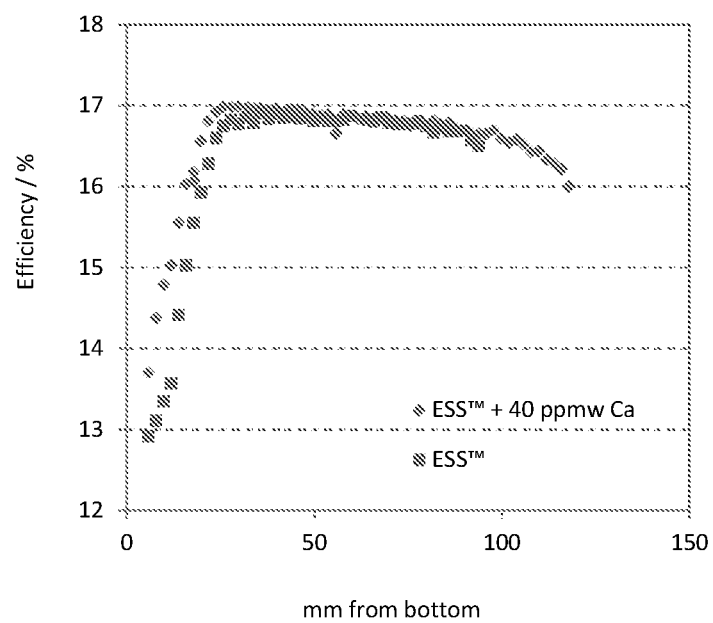
FIG. 4 is a diagram showing the efficiency of solar cells made from wafers cut from the whole height of ingots C and D in Example 1 as a function of mm from bottom of the ingots.

5 mm was cut away from the lower end of the ingots A to D. As stated above normally 3-5 cm are cut from ingots used for wafering. Normal cuts were made on the long sides of the ingots. The reduction of red zone could thus only be demonstrated in the lower part of the ingots. Wafers were cut along the height of the four ingots A to D and processed to solar cells using conventional processing methods and the efficiency of the solar cells were measured. The result for efficiency of solar cells made from ingots A and B are shown in FIGS. 1 and 2 and the results for ingots C and D made from compensated silicon produced by Elkem Solar AS are shown in FIGS. 3 and 4.

Figure 1:
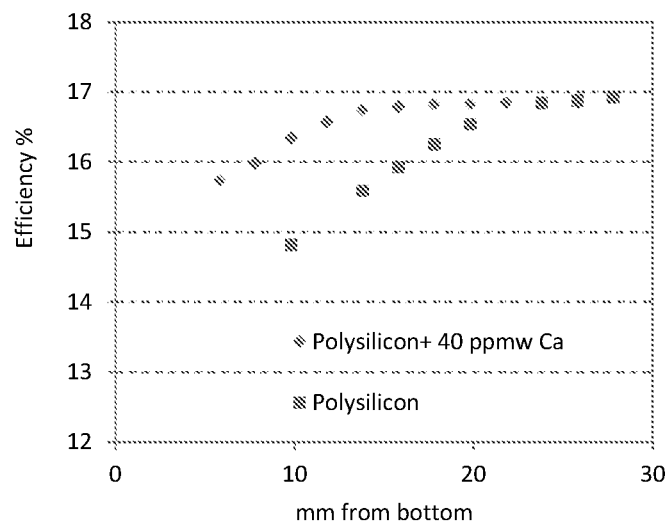
FIG. 1 is a diagram showing the efficiency of solar cells made from wafers cut from the lower part of ingots A and B in Example 1 as a function of mm from bottom of the ingots.

FIG. 1 shows the efficiency of solar cells made from wafers cut from the lower part of ingots A and B. As shown in FIG. 1 the efficiency of solar cells made from wafers from ingot B (polysilicon to which was added 40 ppmw elemental calcium), was much higher than for the solar cells made from wafers from the lower part of ingot A, which did not contain elemental calcium.

It can further be seen from FIG. 1 that solar cells made from wafers cut only about 5 mm from the bottom of Ingot B had an efficiency of almost 16% while a solar cell made from a wafer cut about 10 mm from the bottom of ingot A showed an efficiency of below 15%.

Finally it can be seen from FIG. 1 that the solar cells made from the lower part of Ingot B reached about 17% efficiency for wafers cut 15 mm from the lower end of the ingot while the same efficiency for solar cells made from wafers from Ingot A first reaches 17% efficiency when cut about 25 mm from the lower end of ingot A.

FIG. 2 shows the efficiency of solars cells made from wafers cut along the whole height of Ingot A and Ingot B.

It can be seen from FIG. 2 that the solar cells made from wafers from ingot B have a high efficiency along the total height of the ingot.

FIG. 3 shows the efficiency of solar cells made from wafers cut from the lower parts of Ingots C and D. As shown in FIG. 3, solar cells made from wafers cut from the lower end of ingot D (compensated silicon produced by Elkem AS with addition of 40 ppmw elemental calcium) shows a much higher efficiency then solar cells made from wafers from the lower end of Ingot C (compensated silicon produced by Elkem AS without calcium addition).

FIG. 4 shows the efficiency of solar cells made from wafers cut along the whole height of Ingot C and Ingot D. It can be seen that the solar cells made from ingot D at an average have a higher efficiency then the solar cells made from wafers cut along the height of Ingot C.

This shows that the addition of elemental calcium does not negatively effect the efficiency for solar cells made from wafers cut from the main part of the ingots but in effect tend to increase the efficiency.

The substantial increase in efficiency for solar cells made from wafers cut at the lower end of Ingots B and D containing 40 ppmw elemental calcium compared to the efficiency for solar cells made from wafers cut from ingots A and C, shows that the addition of elemental calcium to the silicon before directional solidification substantially decreases the red zone in the silicon ingots, particularly in the lower end of the ingots.

Example 2

Three directionally solidified multicrystalline silicon ingots E, F, and G of 16 kg each were produced in the same four chamber furnace as described in Example 1. Ingot E was made from compensated silicon containing both boron and phosphorous produced by Elkem Solar AS, (ESS®), having a resistivity of between 1 and 1.3 ohm cm measured at the lower and of the Ingot. Ingot F was compensated silicon produced by Elkem Solar, (ESS®), with addition of 100 ppmw elemental calcium according to the invention. Ingot G was polysilicon with addition of 100 ppmw elemental calcium according to the invention and doped with boron to obtain a resistivity of between 1 and 1.3 ohm cm measured at the lower end of the ingot.

The height and cross-section of ingots E to G were the same as described in Example 1. Further, 5 mm was cut away from the lower ends of ingots E to G. Normal cuts were made from the sides of the ingots.

Figure 5:
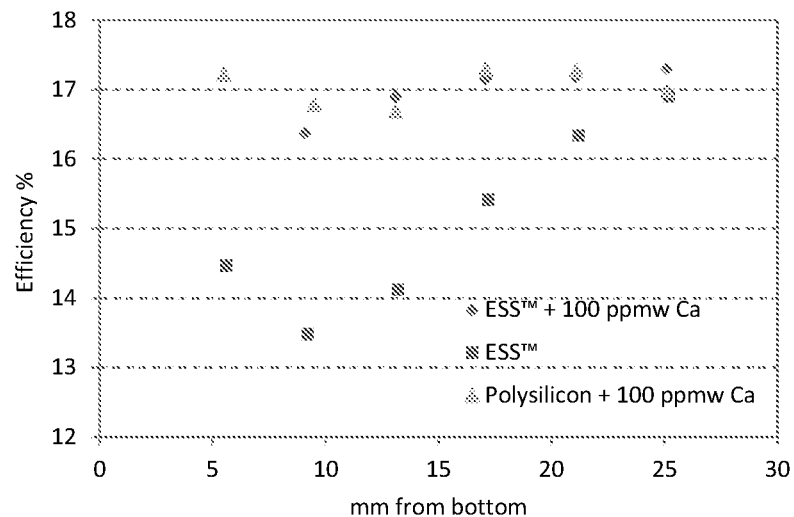
FIG. 5 is a diagram showing the efficiency of solar cells made from wafers cut from the lower part of ingots E, F and G in Example 2 as a function of mm from bottom of the ingots.
Figure 6:
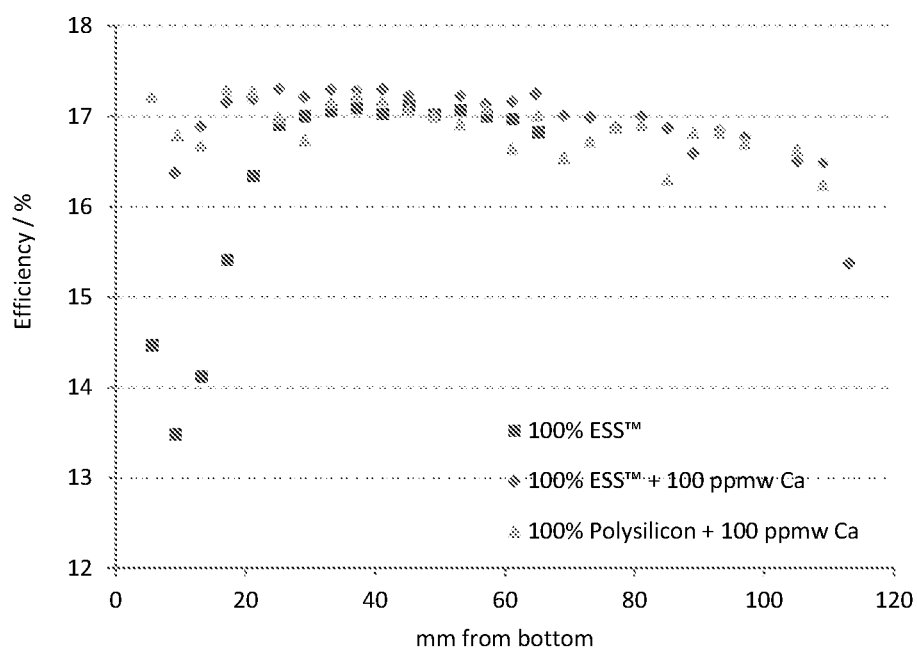
FIG. 6 is a diagram showing the efficiency of solar cells made from wafers cut from the whole height of ingots E, F, and G in Example 2 as a function of mm from bottom of the ingots.

Wafers were cut along the height of ingots E to G and processed to solar cells using conventional processing methods and the efficiency of the solar cells was measured, and the results are shown in FIGS. 5 and 6.

FIG. 5 shows the efficiency of solar cells made from wafers cut from the lower part of ingots E, F and G. As shown in FIG. 5 the efficiency of solar cells made from wafers from ingots F (compensated silicon to which was added 100 ppmw elemental calcium), and ingot G (polysilicon to which was added 100 ppmw elemental calcium), was much higher than for the solar cells made from wafers from the lower part of ingot E, which did not contain calcium. It can further be seen from FIG. 5 that solar cells made from wafers cut only about 5 mm from the bottom of ingot F and G had an efficiency of more than 16% to above 17% while solar cells made from wafers cut about 10 mm from the bottom of ingot E, showed an efficiency of below 15%.

Finally it can be seen from FIG. 5 that the solar cells made from the lower part of ingot F and G reached about 17% efficiency for wafers cut only 5 mm from the lower end of the ingots while the same efficiency for solar cells made from wafers from ingot E first reaches 17% efficiency when cut about 25 mm from the lower end of ingot A.

FIG. 6 shows the efficiency of solars cells made from wafers cut along the whole height of ingots E, F and G. It can be seen from FIG. 6 that the solar cells made from wafers from ingot F and G have a high efficiency along the total height of the ingots even towards the top of the ingots. For ingot E the efficiency starts to decrease at about 65 mm from the bottom of the ingot.

Example 2 shows that addition of 100 ppmw elemental calcium increases the efficiency of the lower part of the ingots substantially and even more than for the wafers of Example 1 with addition of 40 ppmw elemental calcium.

Examples 1 and 2 show clearly that red zone is more or less eliminated with addition of elemental calcium to the silicon according to the present invention. The results also shows that thinner side cuts and top cuts can be done while maintaining a high efficiency of the solar cells.

A method has been invented according to the present invention to ensure a safe and convenient incorporation of calcium when added as a silicon-calcium masteralloy to a charge for producing directionally solidified multicrystalline silicon ingot. Calcium is added as a silicon-calcium masteralloy with high Si content (80-99.5 weight %).

A method for adding calcium to a silicon melt through a masteralloy is a more secure and predictable method for adding calcium.

Example 3

Example 3 describes a method for producing a silicon-calcium masteralloy according to the present invention. The silicon-calcium masteralloy as such and the method for producing said masteralloy must take place under neat conditions and has to exhibit a homogeneous distribution of calcium.

Silicon of high purity, like Elkem Solar Silicon®, is melted preferably under inert atmosphere. Calcium is added to molten silicon in an amount in the range 0.5-20 weight %. The molten charge is then homogenized by mixing thoroughly by stirring and thereafter solidified. The solidification must be performed under neatly controlled conditions to ensure a rapid cooling of the molten charge. This can be done as a thin casting of low height by pouring the molten charge in cooled copper crucibles. It is of importance that the calcium is homogenously distributed in the solidified cast masteralloy.

Several silicon-calcium masteralloys have been made by melting the pure silicon charge and subsequently adding calcium to the charge to obtain an alloy containing 0.5 to 20 weight % calcium. The molten masteralloy is homogenized for some minutes and then quenched rapidly. The level of alloying elements is from 0.5-20%. The masteralloy can be produced in different shapes, for instance as cylindrical shapes of 20-50 mm of diameter and length varying from 10-100 mm. A typical size of the amount of added masteralloy is 100-300 g for a G5 furnace of 400-500 kg.

By inert atmosphere in this example it should be understood that inert atmosphere means at least one of the following gases: nitrogen, argon.

In the present example the masteralloy is as mentioned quenched rapidly which should be understood as a cooling rate of at least 10° C./min preferably at least 50° C./min or more.

Example 4

This example relates to production of directionally solidified silicon ingots where calcium is added to the silicon melt in the form of a silicon-calcium masteralloy. According to the invention adding calcium in the form of a silicon-calcium masteralloy, in which the percentage of alloying element is in the range 0.5-20 weight %, has been tested in an industrial G5 size ingot. G5 size ingot refers to generation 5 ingot furnace which is common knowledge to a person skilled in the art. Both reference ingots, polysilicon and compensated silicon produced by Elkem Solar AS (ESS®), and one ingot according to the present invention, were produced in the same furnace under the same conditions. In the ingot according to the invention compensated silicon produced by Elkem Solar AS (ESS®) was used with addition of 150 grams of a silicon-calcium masteralloy to the charge comprising the silicon.

Figure 7:
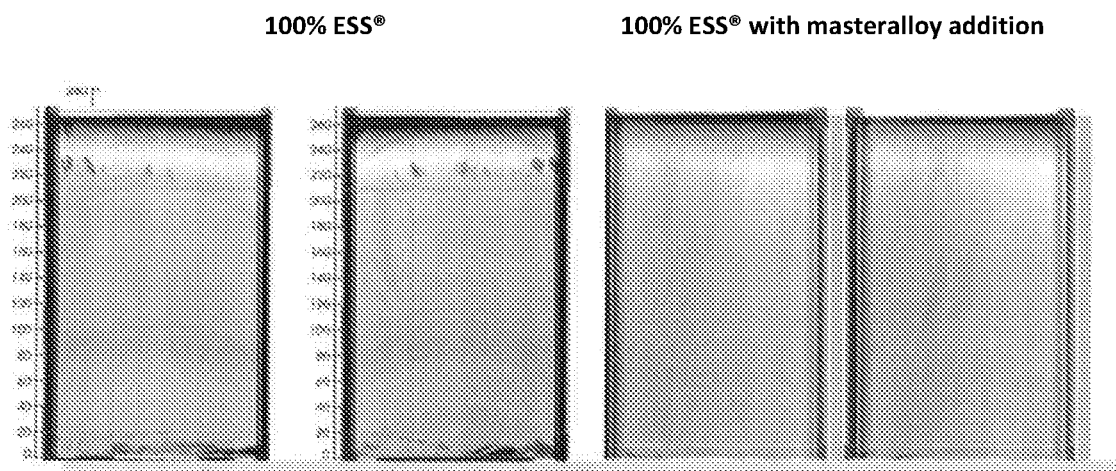
FIG. 7 shows IR image of brick from a G5 ingot with addition of silicon-calcium masteralloy addition to the right and without addition of silicon-calcium masteralloy addition to the left.

The inclusion (particle) contents in the reference ingots and in the ingot according to the invention as revealed by IR-images in FIG. 7 was reduced in the ingot where silicon-calcium masteralloy had been added to the silicon (the figure to the right compared to the ingot without the masteralloy as shown to the left in FIG. 7). FIG. 8 shows lifetime scans of one adjacent to centre brick from all four sides, a) for an ingot with 100% virgin polysilicon made without addition of silicon-calcium masteralloy and average lifetime 4.0 μs, b) for an ingot with 100% ESS® with addition of silicon-calcium masteralloy and average lifetime 5.3 μs and c) for an ingot with 100% ESS® with addition of silicon-calcium masteralloy (bottom) and average lifetime 7.1 μs. Scale of the lifetime scan from 0.4 to 8 μs.

Wafers from the same brick position were processed to solar cells at ISC Konstanz in the same cell batch. FIG. 9 shows as mentioned above the efficiency of solar cells made from wafers cut from adjacent to centre brick and corner brick from G5 ingot made with addition of silicon-calcium masteralloy compared to reference ingots (adjacent to centre brick) of 100% virgin polysilicon and 100% ESS® made in the same furnace. All wafers were processed at International Solar Energy Research Centre in Konstanz, Germany, (ISC). The results in FIG. 9 show an increase of 0.3% absolute in efficiency for the average of the whole bricks when compared to the polysilicon reference, and even more compared to the reference of 100% ESS®.

Having described preferred embodiments of the invention it will be apparent to those skilled in the art that other embodiments incorporating the concepts may be used. These and other examples of the invention illustrated above are intended by way of example only and the actual scope of the invention is to be determined from the following claims.

The invention claimed is:

1. A method for minimizing or removing the red zone in directional solidified multicrystalline silicon ingots comprising adding calcium in its elemental form, or in the form of a silicon-calcium masteralloy comprising elemental calcium in an amount of 0.5-20 weight %, the remaining being high purity silicon, to a silicon melt in an amount chosen from one of the following ranges: 5-9.99 ppmw, 10-500 ppmw, 500-550 ppmw prior to subjecting the silicon melt to directional solidification in a crucible.

2. The method according to claim 1, wherein the calcium is added to the silicon melt in an amount chosen from one of the following ranges: 10-250, 20-250, 10-150, 20-150, 10-100, ppmw.

3. The method according to claim 1, wherein the silicon-calcium masteralloy comprises elemental calcium in an amount chosen from one of the following ranges: 1-15 weight %, 5-15 weight %, the remaining being high purity silicon.

4. The method according to claim 1, wherein the silicon melt is chosen from one of the following: a high purity silicon melt, compensated silicon and polysilicon.

5. The method according to claim 3, wherein the silicon-calcium masteralloy is added to a charge comprising silicon for producing multicrystalline silicon ingots.

6. A directionally solidified multicrystalline silicon ingot, wherein the ingot is obtained by the method according to claim 1.

7. A method for preparing a silicon-calcium masteralloy for addition to a silicon melt when making directionally solidified multicrystalline silicon ingot, wherein said silicon-calcium masteralloy comprises elemental calcium in an amount chosen from one of the following ranges: 0.5-20 weight %, 1-15 weight %, 5-15 weight %, the remaining being high purity silicon, the method comprising adding elemental calcium to a molten high purity silicon in an amount chosen from one of the following ranges 0.5-20 weight %, 1-15 weight %, 5-15 weight %, homogenizing a resulting alloy and solidifying the resulting alloy to provide the silicon-calcium masteralloy.

* * * * *